Oct. 10, 1967 W. B. HARRIS 3,346,745

PULSE GENERATOR

Filed Jan. 24, 1966

INVENTOR

W. B. HARRIS

BY Lucian C. Canepa

ATTORNEY

United States Patent Office 3,346,745

Patented Oct. 10, 1967

3,346,745
PULSE GENERATOR

William B. Harris, Bernardsville, N.J., assignor to Bell Telephone Laboratories, Incorporated, New York, N.Y., a corporation of New York Filed Jan. 24, 1966, Ser. No. 522,516
6 Claims. (Cl. 307—88.5)

This invention relates to pulse-generating circuits and more particularly to a novel arrangement for terminating the pulses generated by such circuits.

Generators of the type that employ a controlled switching device in conjunction with a series-tuned arrangement to supply fixed duration pulses to a load are known. Typical of this type of circuit are those described in "A Simple Pulse Generator Using Silicon Four-Layer Devices" by R. Dunn and J. Wood, Electronic Engineering, July 1963, pages 470–471.

In addition, it is known to enhance the turn-off characteristics of such pulse generators by connecting a second controlled switching device directly in shunt with the load thereof. Activation of the second device at a time that approximates the occurrence of the end of the resonant period of the series-tuned circuit causes the pulse delivered to the load to exhibit a fast fall time. However, in some applications of practical interest, this particular approach to termination of a pulse is disadvantageous in that it necessitates that the beginning of the next subsequent pulse not occur for at least a time interval that approximates the noted resonant period.

Accordingly, an object of the present invention is an improved pulse generator.

More specifically, an object of this invention is an improved pulse termination technique—in particular, a technique that begets a pulse generator that is characterized by a relatively narrow interpulse interval.

Other objects of the present invention are to minimize the time rate of change of voltage across the second device during pulse initiation and to minimize after-pulse ripple effects.

These and other objects of the present invention are realized in a specific illustrative embodiment thereof that comprises a modification of the known pulse generator described above. In accordance with the invention the aforenoted second device is no longer connected directly in shunt with the load. Instead, the second device is connected across both the load and the inductor of the series-tuned arrangement. Additionally, a network comprising a relatively small inductor in parallel with a diode is connected in series with the second device. Also, as in known generators, a diode is connected in an opposed shunt relationship with the second device. The network diode is poled in a series-aiding relationship with respect to the diode that is connected across the second device.

At the instant at which termination of a pulse is desired, the second device is energized thereby in effect short-circuiting the load. Simultaneously the capacitor of the tuned circuit is rapidly recharged in a resonant manner, via the second device and the relatively small inductor, to a voltage that slightly exceeds that of an associated direct current source. Then the overcharged capacitor causes a current to flow back through the two series-aiding diodes, whereby the second device is de-energized and the capacitor is left with a residual voltage thereacross approximately equal to that of the source. At that point the capacitor is in a condition to commence another pulse-generating cycle of operation. However, another such cycle should not be initiated until the second device has remained de-energized for its reverse recovery time, which approximates half of the resonant period of the series-tuned circuit.

Thus, in accordance with the principles of the present invention, the minimum interpulse interval of a particular class of pulse generators is reduced from a full period of a tuned circuit component to approximately one-half period thereof. Also, the novel circuit reduces the tendency of the short-circuiting device to turn ON during pulse initiation. Additionally, in accordance with the invention, after-pulse ripple effects are minimized.

It is a feature of the present invention that the capacitor of a tuned circuit of a pulse generator be resonantly recharged via a path whose characteristic resonant period is significantly less than that of the tuned circuit.

It is another feature of this invention that a pulse-terminating arrangement be connected across a load and the inductor of a series-tuned circuit, and that the arrangement comprise the series connection of two networks, the first network comprising a controlled switching device connected in opposed shunt relationship with a diode, and the second network comprising a relatively small inductor in parallel with a diode that is connected in series aiding with the first-mentioned diode.

A complete understanding of the present invention and of the above and other features and advantages thereof may be gained from a consideration of the following detailed description of an illustrative embodiment thereof shown hereinbelow in connection with the accompanying drawing, in which.

Figure 1A:
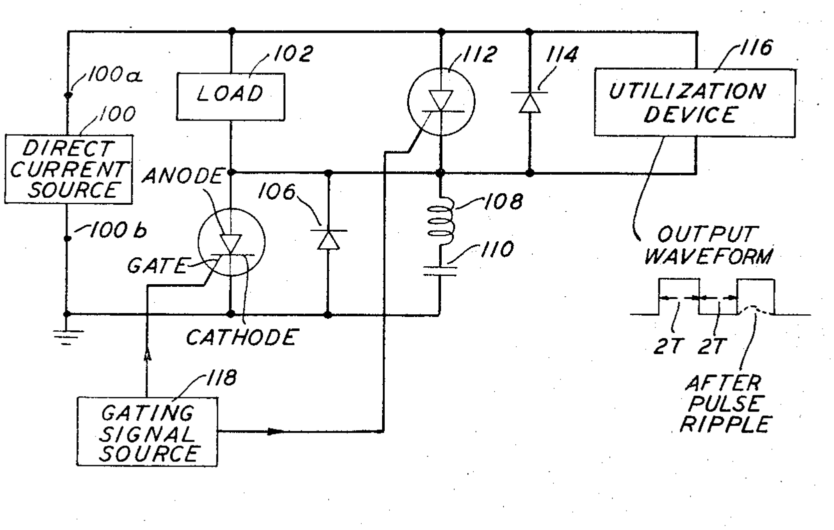
FIG. 1A PRIOR ART
FIG. 1A depicts a pulse generator made in accordance with the prior art.

It will be helpful to a better understanding of this invention to first describe the prior art circuit illustrated in FIG. 1A. The FIG. 1A circuit comprises a direct-current source 100 having upper and lower terminals 100*a* and 100*b*. The upper terminal 100*a* is considered to be positive with respect to the lower one 100*b* which is shown connected to ground. Connected in series across the source 100 are a load 102 and a first controlled switching device 104 which, for example, may be a gated PNPN element that is also commonly referred to as a silicon controlled rectifier. Such a device can be switched to its relatively low impedance state by applying a control signal to the gate electrode thereof. An activated device may be de-energized by applying a reverse voltage between its anode and cathode electrodes. This reverse voltage must be maintained across the device for at least the characteristic forward blocking recovery time thereof. If the reverse voltage is not maintained for at least this time, the device may inadvertently turn ON again (even in the absence of a gating signal) when a forward voltage is reestablished thereacross.

Connected in an opposed shunt relationship with the device 104 of FIG. 1A is a conventional asymmetrically conducting diode 106. Also connected in shunt therewith is a series-tuned circuit that comprises an inductor 108 and a capacitor 110. The resonant half period of this LC circuit is selected to approximate the forward blocking recovery time T of the device 104.

Connected across the load 102 is a second controlled switching device 112, a diode 114 and a utilization device 116. A gating signal source 118 is connected to the devices 104 and 112 for applying sequential enabling signals thereto.

Briefly, the prior art pulse generator shown in FIG. 1A operates as follows. Initially the capacitor 110 is charged to the voltage of the source 100, the top plate of the capacitor 110 being positive with respect to the bottom plate thereof. To initiate a pulse across the load 102, a gating signal is applied by the source 118 to the device 104. This gating signal causes the device 104 to switch to its relatively low impedance state, whereby the positive half of a ringing or resonant cycle ensues. Specifically, current flows from the capacitor 110 through the inductor 108 and the device 104. During this half-cycle, the load 102 is connected across the source 100 via the energized device 104. During the next half ringing cycle, current flows from the capacitor 110 through the diode 106 and the inductor 108. This causes the device 104 to be de-energized. However, the load 102 remains connected to the source 100 via the conducting diode 106.

Finally, when the current through the diode 106 of FIG. 1A equals the load current, the main pulse delivered to the load 102 nominally terminates. Fast fall-off of this pulse is achieved by energizing the device 112 at that time, whereby the load 102 is short-circuited and the main pulse is abruptly terminated.

Energizing the short-circuiting device 112 causes another ringing cycle to occur. During the positive half thereof, the capacitor 110 is resonantly charged to a voltage that exceeds that of the source 100. Thereafter, during the negative half of the cycle, current flows through the diode 114 thereby to de-energize the device 112 and to maintain it de-energized for a period that approximates its forward blocking recovery time.

The duration of the resonant cycle in which current alternately flows through the device 112 and the diode 114 of FIG. 1A is the same as the width of an output pulse of the depicted circuit (see the output waveform shown in FIG. 1A). In other words, the minimum interpulse interval characteristic of the circuit approximates twice the forward blocking recovery time of the devices 104 and 112. This, of course, puts an upper limit on the repetition rate at which pulses can be delivered by the circuit to the utilization device 116.

Another limitation of the circuit shown in FIG. 1A is that a high time rate of change of voltage occurs across the device 112 at the time that the device 104 is energized This high *dv/dt* stems from the fact that at turn-on of the device 104 the anode electrode thereof is rapidly lowered from a positive potential to ground, whereby the cathode electrode of the device 112 is also so lowered. This high *dv/dt* tends to energize the device 112 which, of course, is not desired and must be guarded against by careful circuit design.

Still another limitation of the FIG. 1A circuit resides in the fact that the voltage remaining on the capacitor 110 following resonant current flow through the devices 112 and 114 is typically (due to losses in the circuit) less than that of the source 100. In that event, a subsequent current flows through the load 102 and the inductor 108 to charge the capacitor 110 to the voltage of the source 100. This flow of current manifests itself as an after-pulse ripple voltage which in many applications is highly undesirable and may even be deleterious.

Figure 1B:
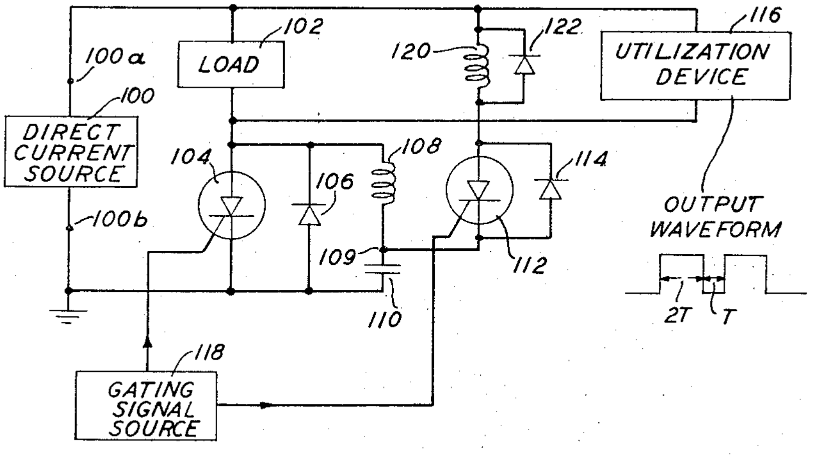
FIG. 1B shows a specific illustrative pulse generator which embodies the principles of the present invention.

Some of the components included in the inventive arrangement of FIG. 1B are identical to those shown in FIG. 1A. These identical components are designated in FIG. 1B by the same reference numerals employed above.

The FIG. 1B circuit differs in two main structural respects from the prior art arrangement of FIG. 1A. First, in FIG. 1B the device 112 and the diode 114 are connected in series with a network that comprises an inductor 120 in parallel with a diode 122. The value of the inductor 120 is small relative to that of the inductor 108, whereby the resonant period defined by the elements 110 and 120 is much less than that characteristic of the elements 108 and 110. A ratio of 1:15 is exemplary.

The other structural difference embodied in the FIG. 1B circuit is that the cathode electrode of the device 112 is not connected directly to the lower end of the load 102, as it is in FIG. 1A. Instead, the cathode electrode of the device 112 is connected to a point 109 that is between the inductor 108 and the capacitor 110.

The two differences described above provide the FIG. 1B circuit with improved functional capabilities relative to those of the circuit shown in FIG. 1A. These improved capabilities are apparent from the description hereinbelow of the mode of operation of the FIG. 1B circuit.

The initiation of an output pulse in the FIG. 1B arrangement is identical to that described above in connection with FIG. 1A. The pulse termination process in FIG. 1B is enhanced if the diode 106 is selected to be of the so-called slow type. This conventional type of device transmits current therethrough in the reverse direction for a predetermined interval of time after a reverse voltage is applied thereacross. Advantageously, this interval is selected to permit load current to flow through the diode 106 until the resonant current flowing in the inductor 108 is approximately zero.

At the moment at which the load current of the FIG. 1B arrangement nominally terminates, the device 112 is energized. In effect this action short-circuits the load 102 (which is, advantageously, a purely resistive load) and causes resonant charging of the capacitor 110 via the device 112 and the relatively small inductor 120. The capacitor 110 charges toward a voltage that approximates twice that of the source 100. However, as the voltage across the capacitor 110 rises above that of the source 100 by the amount of the additive forward breakdown voltages of the series-aiding diodes 114 and 122, the noted diodes are rendered conductive. The resulting drop across the diode 114 is effective to de-energize the switching device 112. The diode 122 bypasses the inductor 120 and acts to dissipate any energy stored in the inductor 120 thereby to prevent the occurrence in the circuit of a second forward ringing cycle which would tend to re-energize the device 112.

Hence at the end of a relatively brief period of time, illustratively only about one-fifteenth the resonant period of the series-tuned arrangement comprising the elements 108 and 110, the device 112 of FIG. 1B has been de-energized and the capacitor 110 thereof has been recharged to a voltage that approximates that of the source 100.

Another pulse may be initiated in the FIG. 1B circuit at any time after the device 112 has remained de-energized for its forward blocking recovery time. Since this time approximates the half period of the series-tuned circuit comprising the elements 108 and 110, it is apparent that the minimum interpulse interval of the FIG. 1B circuit is one-half that of the prior art arrangement shown in FIG. 1A (see the output waveform shown in FIG. 1B).

In addition, it is significant to note that the FIG. 1B circuit is characterized by a lower *dv/dt* across the device 112 when the device 104 is energized. This property stems from the fact that the cathode electrode of the device 112 is connected directly to the capacitor 110 rather than to the anode electrode of the device 104. The voltage across the capacitor 110 does not change abruptly when the device 104 is energized. Instead, the voltage thereacross decreases in a sinusoidal fashion. As a result, the time rate of change of voltage across the device 112 is less than that that occurs at turn-on in the FIG. 1A arrangement. Consequently, in accordance with the invention, the chances of an inadvertent energization of the short-circuiting device 112 during pulse initiation are considerably lessened.

The FIG. 1B circuit is also characterized by negligible after-pulse ripple. This is so because the capacitor 110 is clamped by the diodes 114 and 122 at a voltage only slightly less than that of the source 100. Hence only a relatively small additional charge must be added to the capacitor 110 (via the load 102) to charge the capacitor 10 to the voltage of the source 100. As a practical matter, this charging current through the load 102 has been found to produce a negligible after-pulse ripple voltage.

Thus there has been described herein an improved pulse generating circuit characterized by a reduced minimum interpulse interval. This reduced interval is achieved by the simple and novel expedient of providing (for the capacitor 110) a distinct resonant charging path that exhibits a relatively short ringing period. The improved circuit is also characterized by (1) a reduced *dv/dt* across the short-circuiting device 112 during pulse initiation and (2) a negligible after-pulse ripple voltage.

It is to be understood that the above-described arrangement is only illustrative of the application of the principles of the present invention. In accordance with these principles numerous other arrangements may be devised by those skilled in the art without departing from the spirit and scope of the invention.

What is claimed is:

1. In combination in a pulse generator, a controlled switching device connected in an opposed shunt relationship with an asymmetrically conducting diode and further connected in shunt with a series-tuned circuit comprising an inductor and a capacitor, said circuit including a junction point between said inductor and capacitor, a load and a direct-current source connected in series with said device, said series arrangement including a junction point between said source and load, and means connected between said junction points for rapidly recharging said capacitor at the termination of a pulse.

2. A combination as in claim 1 wherein said recharging means comprises an additional controlled switching device, said combination further including a gating signal source connected to said first- and second-mentioned devices for applying sequential energizing signals thereto.

3. A combination as in claim 2 further including an additional asymmetrically conducting diode connected in an opposed shunt relationship with said second-mentioned device.

4. A combination as in claim 3 further including a network in series with said second-mentioned device, said network comprising an inductor in parallel with still another asymmetrically conducting diode, the value of said inductor being small relative to that of said first-mentioned inductor, and said second- and third-mentioned diodes being connected in series aiding.

5. A combination as in claim 4 wherein each of said controlled switching devices comprises a gated PNPN element that is characterized by a forward blocking recovery time that approximates half the resonant period of said series-tuned circuit.

6. In combination in a pulse generator, a direct-current source, a load, a first network comprising a first controlled switch connected in a series-opposed parallel relationship with a first asymmetrically conducting diode and further connected in parallel with a series-tuned arrangement including a main inductor and a capacitor, said arrangement including a junction point between said inductor and capacitor, means including said load connecting said first network across said source, said means including a junction point between said load and said source, a second network comprising a second controlled switch connected in a series-opposed parallel relationship with a second asymmetrically conducting diode, a third network comprising a third asymmetrically conducting diode connected in parallel with an auxiliary inductor, means connecting said second and third networks in series such that said second and third diodes are poled in a series-aiding relationship thereby to form a pulse-terminating configuration, and means connecting said pulse-terminating configuration between said junction points.

No references cited.

ARTHUR GAUSS, *Primary Examiner.*

B. P. DAVIS, *Assistant Examiner.*